United States Patent
Okumura

(10) Patent No.: US 10,886,323 B2
(45) Date of Patent: Jan. 5, 2021

(54) INFRARED DETECTOR, INFRARED DETECTION DEVICE, AND METHOD OF MANUFACTURING INFRARED DETECTOR

(71) Applicant: FUJITSU LIMITED, Kawasaki (JP)

(72) Inventor: Shigekazu Okumura, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 12 days.

(21) Appl. No.: 16/438,521

(22) Filed: Jun. 12, 2019

(65) Prior Publication Data

US 2020/0013822 A1 Jan. 9, 2020

(30) Foreign Application Priority Data

Jul. 5, 2018 (JP) ................................. 2018-128549

(51) Int. Cl.
*H01L 27/146* (2006.01)
*H01L 31/0352* (2006.01)
*H01L 31/0304* (2006.01)
*H01L 31/18* (2006.01)

(52) U.S. Cl.
CPC .... *H01L 27/14652* (2013.01); *H01L 27/1465* (2013.01); *H01L 27/14649* (2013.01); *H01L 27/14687* (2013.01); *H01L 27/14689* (2013.01); *H01L 27/14694* (2013.01);
(Continued)

(58) Field of Classification Search
CPC ........... H01L 27/14649; H01L 27/1465; H01L 27/14652; H01L 27/14687; H01L 27/14689; H01L 27/14694; H01L 31/0304; H01L 31/035263; H01L 31/184; H01L 31/1876
See application file for complete search history.

(56) References Cited

U.S. PATENT DOCUMENTS 5,627,082 A * 5/1997 Beratan et al. ........... G01J 5/20
438/55
2004/0238743 A1* 12/2004 Gravrand et al. ..........................
H01L 27/14649
250/338.4
(Continued)

FOREIGN PATENT DOCUMENTS

JP 2012-094761 5/2012
JP 2015-073029 4/2015
(Continued)

*Primary Examiner* — Stephen W Smoot
(74) *Attorney, Agent, or Firm* — Fujitsu Patent Center

(57) ABSTRACT

An infrared detector includes a pixel separation wall. The infrared detector includes a semiconductor crystal substrate; a first contact layer formed on the semiconductor crystal substrate, a pixel separation wall formed on the first contact layer and configured to separate pixels; a buffer layer formed on the first contact layer and on a side surface of the pixel separation wall in a region surrounded by the pixel separation wall, an infrared-absorbing layer formed on the buffer layer, a second contact layer formed on the infrared-absorbing layer, an upper electrode formed on the second contact layer, and a lower electrode formed on the first contact layer. The buffer layer and the first contact layer are formed of a compound semiconductor of a first conductivity type. The pixel separation wall and the second contact layer are formed of a compound semiconductor of a second conductivity type.

20 Claims, 16 Drawing Sheets

(52) U.S. Cl.
CPC .. *H01L 31/0304* (2013.01); *H01L 31/035263* (2013.01); *H01L 31/184* (2013.01); *H01L 31/1876* (2013.01)

(56) References Cited

U.S. PATENT DOCUMENTS

| | | | |
|---|---|---|---|
| 2011/0073762 A1* | 3/2011 | Soma | H01L 27/14625 250/338.4 |
| 2014/0285671 A1* | 9/2014 | Ishii | H01L 27/14618 348/164 |
| 2015/0097157 A1 | 4/2015 | Onakado | |
| 2015/0340391 A1* | 11/2015 | Webster | H01L 27/14621 348/322 |
| 2016/0172411 A1 | 6/2016 | Tsuji | |
| 2017/0358613 A1 | 12/2017 | Okumura et al. | |
| 2019/0013427 A1* | 1/2019 | Ting | H01L 27/1463 |

FOREIGN PATENT DOCUMENTS

| | | |
|---|---|---|
| JP | 2016-111295 | 6/2016 |
| JP | 2017-220648 | 12/2017 |

* cited by examiner

US 10,886,323 B2

INFRARED DETECTOR, INFRARED DETECTION DEVICE, AND METHOD OF MANUFACTURING INFRARED DETECTOR

CROSS-REFERENCE TO RELATED APPLICATION

This application is based upon and claims the benefit of priority of the prior Japanese Patent Application No. 2018-128549, filed on Jul. 5, 2018, the entire contents of which are incorporated herein by reference.

FIELD

The embodiments discussed herein are related to an infrared detector, an infrared detection device, and a method of manufacturing an infrared detector.

BACKGROUND

As infrared detectors formed by semiconductor materials are configured to detect infrared rays, for example, there is an infrared detector including, on a gallium antimonide (GaSb) substrate, an infrared-absorbing layer formed of the type-II superlattice (T2SL) structure of indium arsenide (InAs)/GaSb. This InAs/GaSb superlattice structure has a type-II band lineup, and hence through adjustment of the film thickness or period of the superlattice, infrared rays from a middle wave (MW) having a wavelength from 3 to 5 micrometers (μm) to a long wave (LW) having a wavelength from 8 to 10 μm may be detected. Such an infrared detector having the T2SL structure is expected to have a longer minority carrier lifetime and a higher sensitivity than devices using mercury-cadmium-tellurium (MCT), which are widely used currently, and to operate at a higher temperature than such devices.

An infrared detector in which a focal plane array (FPA) is formed by forming a pixel separation groove for separating pixels to form a plurality of electrically separated pixels may detect two-dimensional images. Japanese Laid-open Patent Publication No. 2016-111295 and Japanese Laid-open Patent Publication No. 2017-220648 are examples of related arts.

Incidentally, GaSb having a T2SL structure formed therein is likely to be oxidized. When a pixel separation groove is formed and the end surface of a GaSb layer is thus exposed, this portion is exposed to the atmosphere to be oxidized. In this way, an interface state is formed in the oxidized portion of GaSb, and current easily flows through such a portion, resulting in an increase in dark current. The increase in dark current leads to a reduction in signal-to-noise (S/N) ratio of an infrared detector, which is not preferred.

An infrared detector having low dark current and including an infrared-absorbing layer formed of a T2SL structure and separated pixels has therefore been demanded.

SUMMARY

According to an aspect of the embodiments, an infrared detector includes a pixel separation wall. The infrared detector includes: a semiconductor crystal substrate; a first contact layer formed of a compound semiconductor of a first conductivity type on the semiconductor crystal substrate; the pixel separation wall configured to separate pixels, the pixel separation wall being formed of a compound semiconductor of a second conductivity type on the first contact layer; a buffer layer formed of the compound semiconductor of the first conductivity type on the first contact layer and a side surface of the pixel separation wall in a region surrounded by the pixel separation wall; an infrared-absorbing layer formed of a compound semiconductor on the buffer layer; a second contact layer formed of the compound semiconductor of the second conductivity type on the infrared-absorbing layer; an upper electrode formed on the second contact layer; and a lower electrode formed on the first contact layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
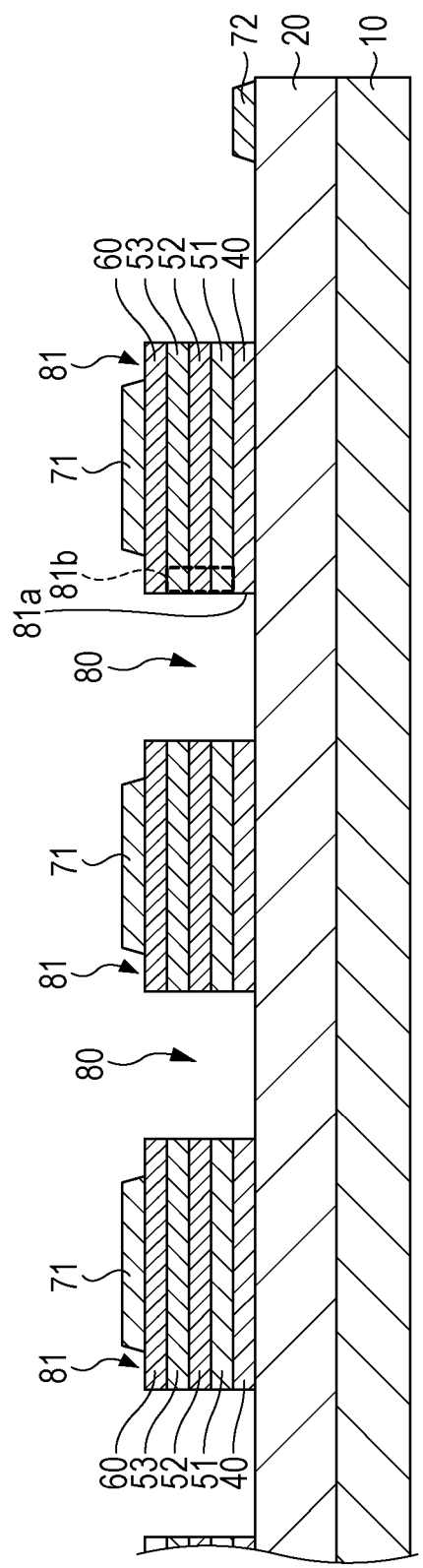
FIG. 1 is a structural diagram of an infrared detector in which a pixel separation groove is formed.

Embodiments for carrying out the present technology are now described. The same members and the like are denoted by the same reference characters, and description thereof is omitted. To the film thickness of each layer described in the drawings of the present application, an accurate film thickness is not reflected in some cases for illustrative purposes.

First Embodiment

First, an infrared detector in which a pixel separation groove is formed so that pixels are separated from each other is described with reference to FIG. 1. The infrared detector having the structure illustrated in FIG. 1 is formed of a first contact layer 20, a buffer layer 40, a p-T2SL layer 51, an i-T2SL absorbing layer 52, an n-T2SL layer 53, and a second contact layer 60 laminated on a GaSb substrate 10. A pixel separation groove 80 is formed by removing the second contact layer 60, the n-T2SL layer 53, the i-T2SL absorbing layer 52, the p-T2SL layer 51, and the buffer layer 40, and the pixels of the infrared detector are formed of mesas 81 separated from each other by the pixel separation groove 80. On the second contact layer 60 of the mesa 81 that serves as each pixel, an upper electrode 71 that serves as an individual electrode is formed, and on the first contact layer 20, a lower electrode 72 that serves as a common electrode is formed.

The first contact layer 20 is formed of p-GaAs that is doped with beryllium (Be) as a p-type impurity element and has a thickness of 1000 nanometers (nm), and the buffer layer 40 is formed of p-GaAs doped with Be as the p-type impurity element. The p-T2SL layer 51, the i-T2SL absorbing layer 52, and the n-T2SL layer 53 are each formed of the T2SL structure of InAs/GaSb. The p-T2SL layer 51 is doped with Be as the p-type impurity element, and the n-T2SL layer 53 is doped with silicon (Si) as an n-type impurity element. The second contact layer 60 is formed of n-InAs doped with Si as the n-type impurity element.

In the infrared detector having such a structure, the mesas 81 that serve as the pixels are formed by forming the pixel separation groove 80. On a side surface 81a of the mesa 81, the end surfaces of the n-T2SL layer 53, the i-T2SL absorbing layer 52, and the p-T2SL layer 51 are exposed. The n-T2SL layer 53, the i-T2SL absorbing layer 52, and the p-T2SL layer 51 each have the superlattice structure of InAs/GaSb, and GaSb is particularly likely to be oxidized when being exposed to the atmosphere, for example. When GaSb or the like is oxidized, an interface state is formed and current easily flows through an oxidized portion 81b of T2SL, which is surrounded by the broken line, resulting in an increase in dark current. This leads to a reduction in S/N ratio of the infrared detector. A method of forming a nitride film on the side surface 81a of the mesa 81 by a plasma treatment is conceivable, but an interface state is formed even on the nitride film and it is difficult to alleviate oxidation of GaSb or the like by forming the nitride film.

An infrared detector including an infrared-absorbing layer formed of a T2SL structure and separated pixels and having low dark current and a high S/N ratio has therefore been demanded.

(Infrared Detector)

Figure 2:
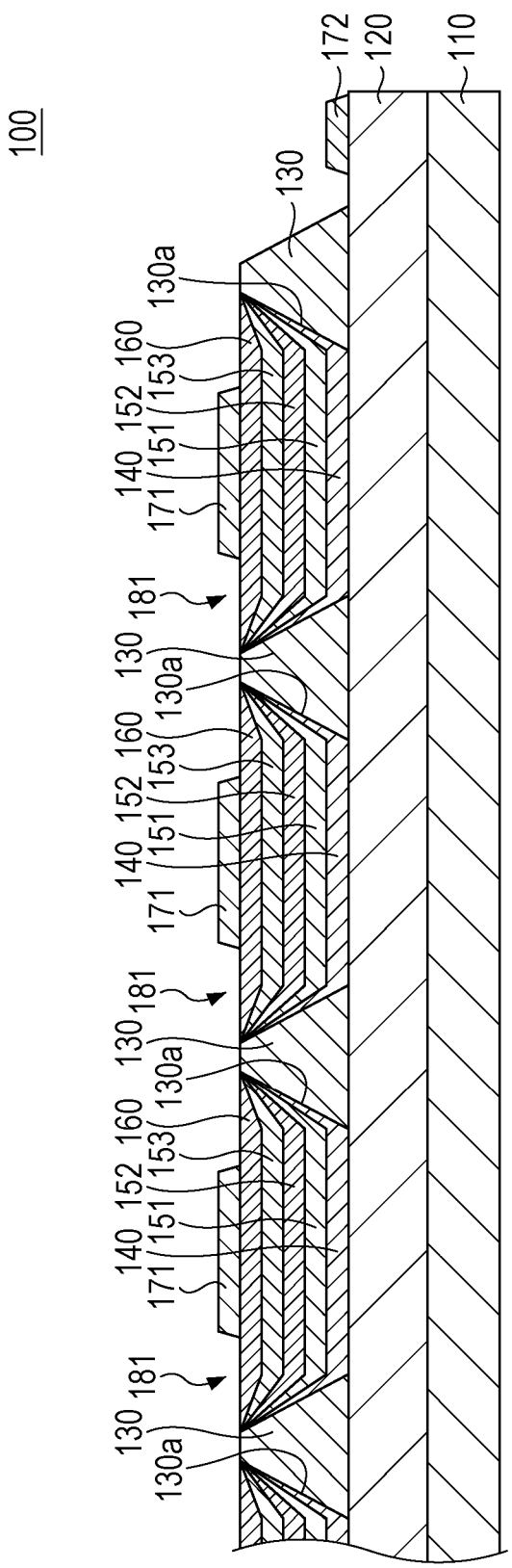
FIG. 2 is a structural diagram of an infrared detector according to a first embodiment.

An infrared detector according to a first embodiment is described next. An infrared detector 100 according to the present embodiment is formed by epitaxially growing compound semiconductor layers on a GaSb substrate 110, which is a semiconductor crystal substrate, by molecular beam epitaxy (MBE). Specifically, as illustrated in FIG. 2, a first contact layer 120 is formed on the GaSb substrate 110, and a pixel separation wall 130 configured to separate pixels is formed on the first contact layer 120, for example. The pixel separation wall 130 is formed to surround each pixel. The pixel separation wall 130 has a trapezoid shape in section, and a side surface 130a is inclined.

On the first contact layer 120 in the region surrounded by the pixel separation wall 130, a buffer layer 140, a p-T2SL layer 151, an i-T2SL absorbing layer 152, an n-T2SL layer 153, and a second contact layer 160 are laminated. In this way, each of pixels 181 is formed of the buffer layer 140, the p-T2SL layer 151, the i-T2SL absorbing layer 152, the n-T2SL layer 153, and the second contact layer 160 formed in the region surrounded by the pixel separation wall 130. On the second contact layer 160 of each of the pixels 181, an upper electrode 171 that serves as an individual electrode is formed, and on the first contact layer 120, a lower electrode 172 that serves as a common electrode is formed.

The first contact layer 120 is formed of p-GaAs that is doped with Be as the p-type impurity element and has a thickness of 1000 nm, and the buffer layer 140 is formed of p-GaAs doped with Be as the p-type impurity element. The p-T2SL layer 151, the i-T2SL absorbing layer 152, and the n-T2SL layer 153 are each formed of the T2SL structure of InAs/GaSb. The p-T2SL layer 151 is doped with Be as the p-type impurity element, and the n-T2SL layer 153 is doped with Si as the n-type impurity element. The i-T2SL absorbing layer 152 is a non-doped layer doped with no impurity element. The second contact layer 160 is formed of n-InAs doped with Si as the n-type impurity element.

The infrared detector according to the present embodiment detects infrared rays incident on the rear surface of the GaSb substrate 110 on which the compound semiconductor layers are not formed. In this application, the p-T2SL layer 151, the i-T2SL absorbing layer 152, and the n-T2SL layer 153 are sometimes referred to as "infrared-absorbing layer".

In the infrared detector according to the present embodiment, the pixel separation wall 130 is formed so that the end of each of the pixels 181 is formed on the inclined side surface 130a of the pixel separation wall 130 in a laminated manner. The end surfaces of the n-T2SL layer 153, the i-T2SL absorbing layer 152, and the p-T2SL layer 151 are thus not exposed. This means that the n-T2SL layer 153, the i-T2SL absorbing layer 152, and the p-T2SL layer 151 are not exposed to the atmosphere and are therefore not oxidized. As a consequence, the dark current is not increased and the S/N ratio of the infrared detector is not reduced.

The buffer layer 140 is in contact with the pixel separation wall 130 on the side surface 130a of the pixel separation wall 130, and the pixel separation wall 130 is formed of n-GaSb while the buffer layer 140 is formed of p-GaSb. Thus, a depletion layer is formed on the side surface 130a of the pixel separation wall 130 by a p-n junction so that the respective pixels 181 are insulated from each other.

Figure 3:
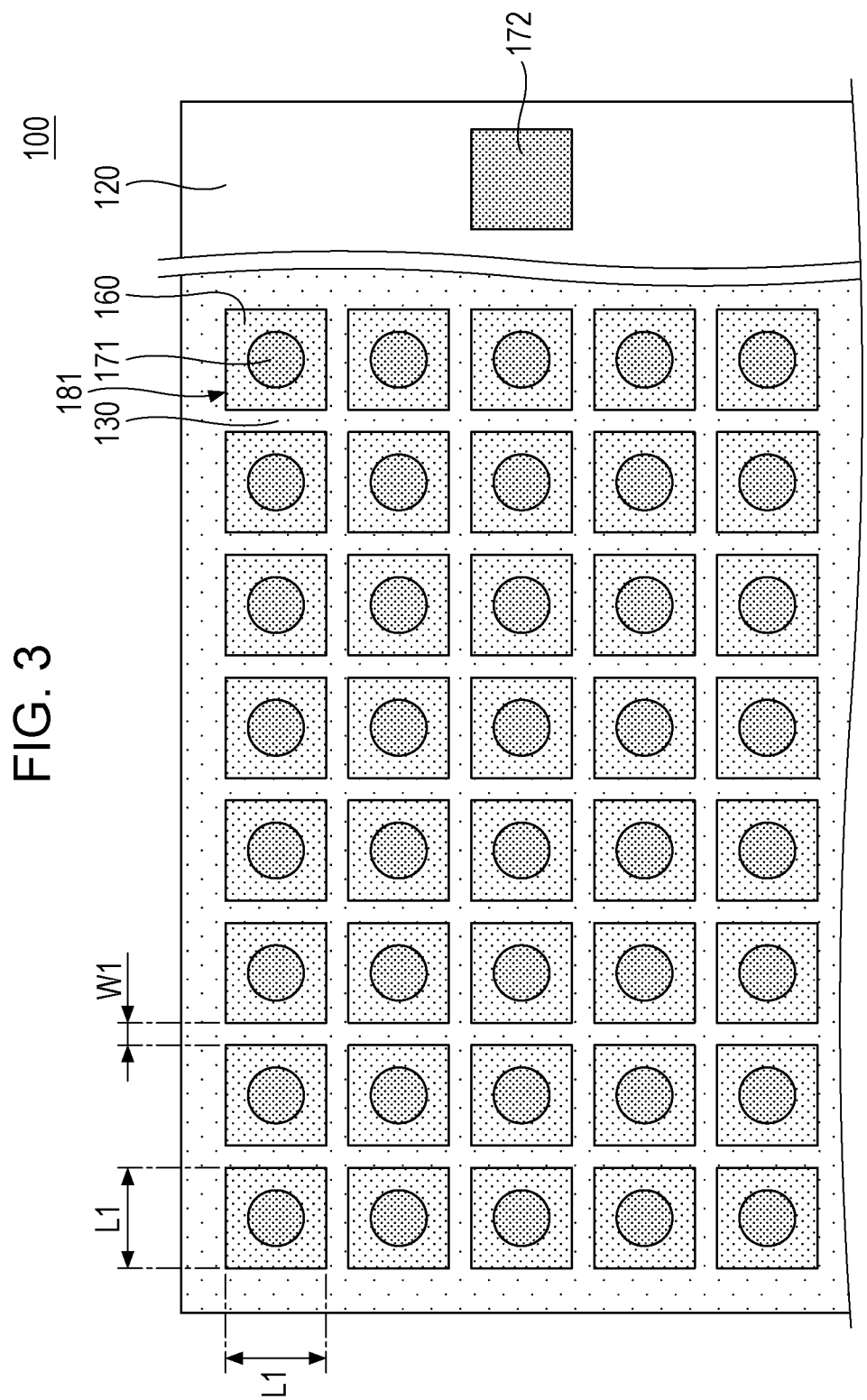
FIG. 3 is a top view of the infrared detector according to the first embodiment.

FIG. 3 is a plan view of the surface of the infrared detector according to the present embodiment that is opposite to the incident surface that infrared rays enter. In FIG. 3, the size ratio, the number of pixels 181, and other matters are different from those in FIG. 2 for convenience. In the infrared detector according to the present embodiment, the substantially square pixels 181 each having a side length L1 of approximately 50 µm are two-dimensionally arranged. The pixel separation wall 130 is formed between the pixel 181 and the pixel 181, and an interval W1 between the pixel 181 and the pixel 181 adjacent to each other is approximately 10 µm.

(Method of Manufacturing Infrared Detector)

A method of manufacturing an infrared detector according to the present embodiment is described next with reference to FIG. 4 to FIG. 13.

Figure 4:
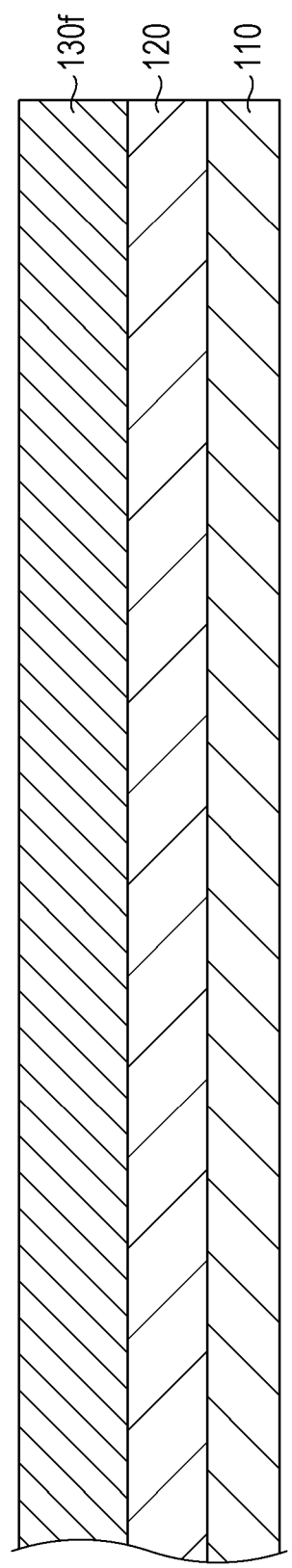
FIG. 4 is a process step diagram (1) of a method of manufacturing an infrared detector according to the first embodiment.

As illustrated in FIG. 4, on the GaSb substrate 110, the first contact layer 120 and a separation wall forming layer 130f are formed in a laminated manner. The first contact layer 120 and the separation wall forming layer 130f are formed by solid-source molecular beam epitaxy (SSMBE). Specifically, the GaSb substrate 110 is put in a chamber of a solid-source molecular beam epitaxy apparatus, and the GaSb substrate 110 is heated, for example. When the temperature of the GaSb substrate 110 reaches 400° C., the GaSb substrate 110 is further heated while the surface of the GaSb substrate 110 is being irradiated with an Sb beam. When the temperature of the GaSb substrate 110 reaches 500° C., an oxide film on the surface of the GaSb substrate 110 starts to be decomposed. With the temperature of the GaSb substrate 110 being 530° C., the surface of the GaSb substrate 110 is irradiated with the Sb beam for 20 minutes so that the oxide film on the surface of the GaSb substrate 110 is completely desorbed.

The temperature of the GaSb substrate 110 is lowered to 520° C. while Sb beam radiation is continued. Ga beam and Be beam radiation is further performed to form, on the GaSb substrate 110, a p-GaSb film having a thickness of approximately 1000 nm so that the first contact layer 120 is formed. Here, the concentration of Be that is an impurity element with which the first contact layer 120 is doped is $1.0 \times 10^{18}$ $cm^{-3}$, for example.

Be beam radiation is stopped and Si beam radiation is started to form, on the first contact layer 120, an n-GaSb film having a thickness of approximately 3000 nm so that the separation wall forming layer 130f is formed. Here, the concentration of Si that is an impurity element with which the separation wall forming layer 130f is doped is $1.0 \times 10^{18}$ $cm^{-3}$, for example.

Ga beam and Si beam radiation is stopped while Sb beam radiation is continued so that the temperature of the GaSb substrate 110 is lowered. When the temperature of the GaSb substrate 110 reaches 400° C., Sb beam radiation is stopped. When the temperature of the GaSb substrate 110 reaches 100° C. or lower, the GaSb substrate 110 having formed thereon the first contact layer 120 and the separation wall forming layer 130f is taken out from the chamber.

Figure 5:
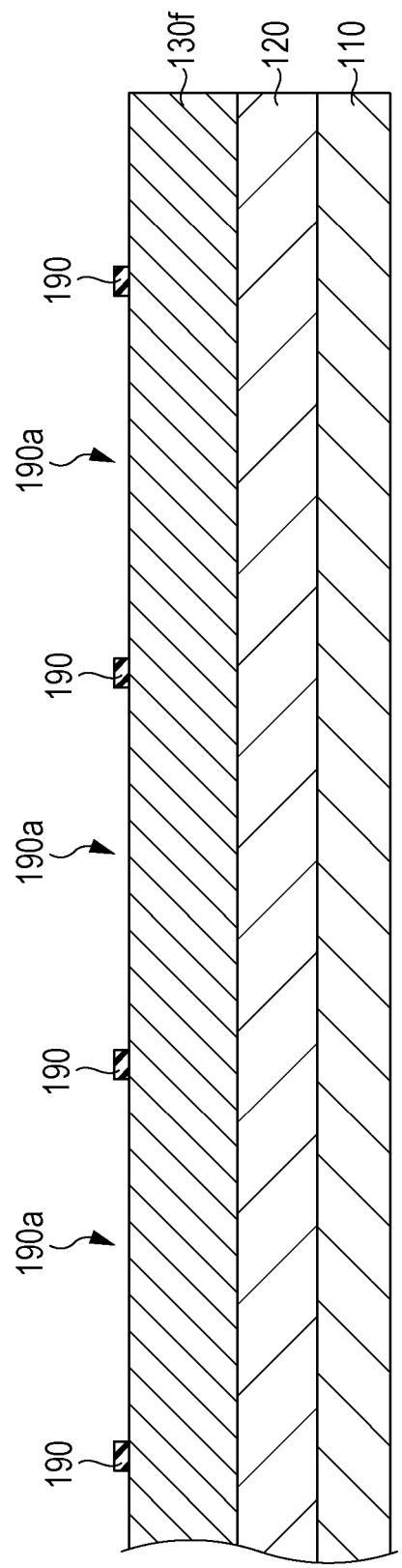
FIG. 5 is a process step diagram (2) of the method of manufacturing an infrared detector according to the first embodiment.

As illustrated in FIG. 5, a silicon oxide mask 190 is formed on the separation wall forming layer 130f. Specifically, the GaSb substrate 110 having formed thereon the components up to the separation wall forming layer 130f is put in a chamber of a plasma enhanced chemical vapor deposition (PE-CVD) apparatus, and a silicon oxide film is formed on the separation wall forming layer 130f, for example. The formed silicon oxide film has a film thickness of approximately 100 nm and is formed at a film forming temperature of 350° C. The GaSb substrate 110 having the silicon oxide film formed thereon is taken out from the chamber of the PE-CVD apparatus. A photoresist is applied on the surface of the silicon oxide film, and the resultant is subjected to exposure by an exposure apparatus and development so that a resist pattern, which is not illustrated, is formed. This resist pattern is formed over a region of the silicon oxide film in which the silicon oxide mask 190 is to be formed. The silicon oxide film in a region in which the resist pattern has not been formed is removed by wet etching using dilute hydrofluoric acid (DHF) to expose the surface of the separation wall forming layer 130f, with the result that the silicon oxide mask 190 having an opening portion 190a is formed. The resist pattern, which is not illustrated, is removed by an organic solvent, for example.

Figure 6:
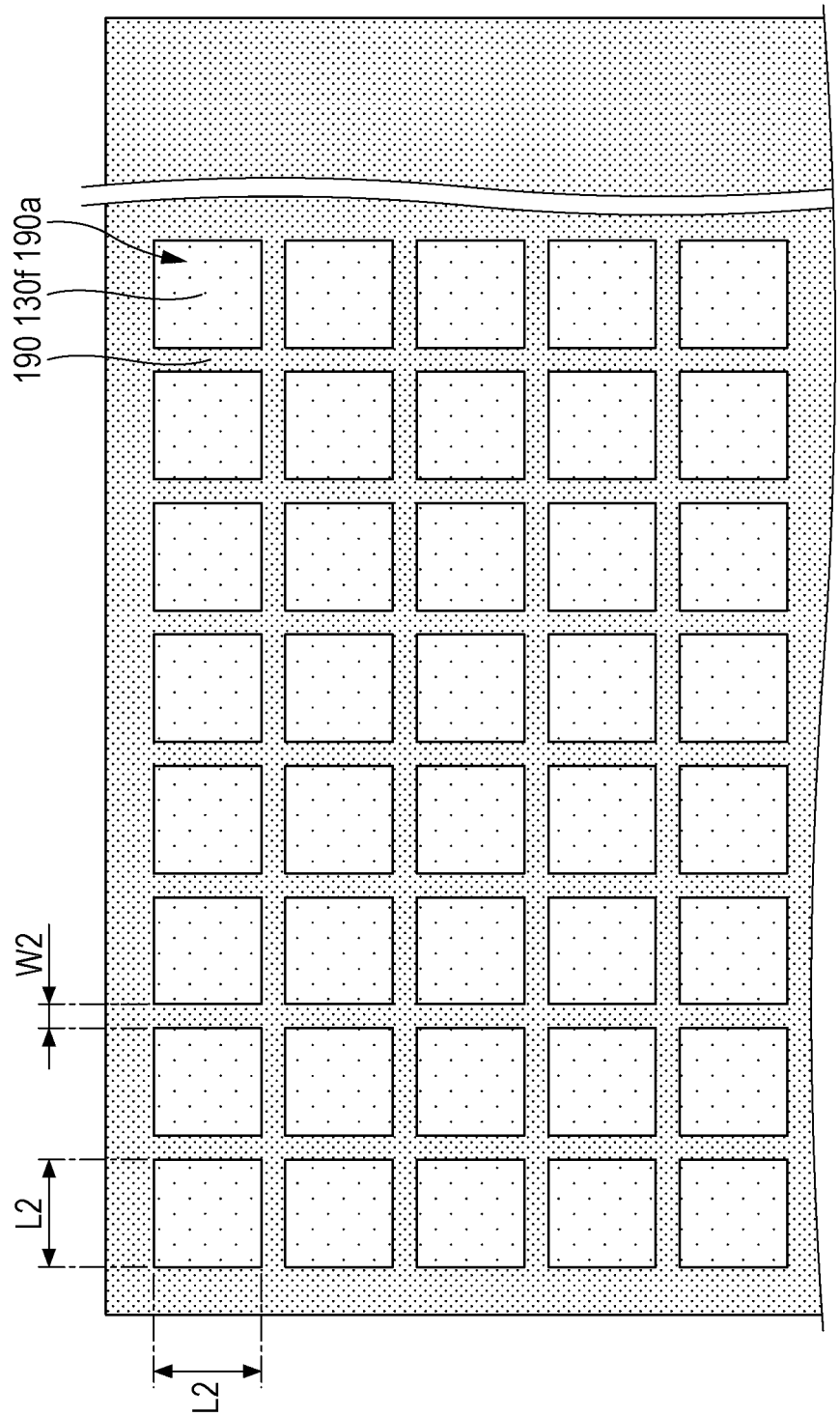
FIG. 6 is a process step diagram (3) of the method of manufacturing an infrared detector according to the first embodiment.

FIG. 6 is a plan view of the surface on which the silicon oxide mask 190 is formed. In FIG. 6, the size ratio and other matters are different from those in FIG. 5 for convenience. In the silicon oxide mask 190, the substantially square opening portions 190a each having a side length L2 of approximately 50 μM are two-dimensionally arranged. A width W2 of the silicon oxide mask 190 between the opening portion 190a and the opening portion 190a is approximately 10 μm.

Figure 7:
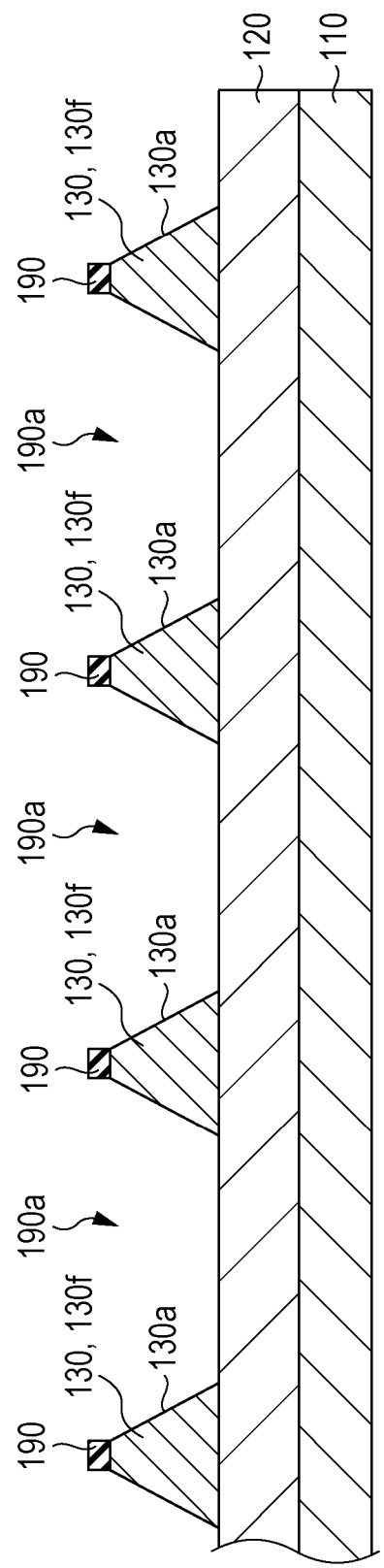
FIG. 7 is a process step diagram (4) of the method of manufacturing an infrared detector according to the first embodiment.

As illustrated in FIG. 7, the separation wall forming layer 130f in the opening portion 190a of the silicon oxide mask 190 is removed by wet etching using an etchant including phosphoric acid, hydrogen peroxide solution, and water. With this, the pixel separation wall 130 is formed of the remaining separation wall forming layer 130f. The thus formed pixel separation wall 130 is formed to surround regions in which the pixels are to be formed. The pixel separation wall 130 is formed by wet etching, and hence the side surface 130a has an exposed (111) surface and is thus inclined. The surface of the first contact layer 120 is a (001) surface, and an inclination angle at which the side surface 130a of the pixel separation wall 130 is inclined from the surface of the first contact layer 120 is approximately 54°.

Figure 8:
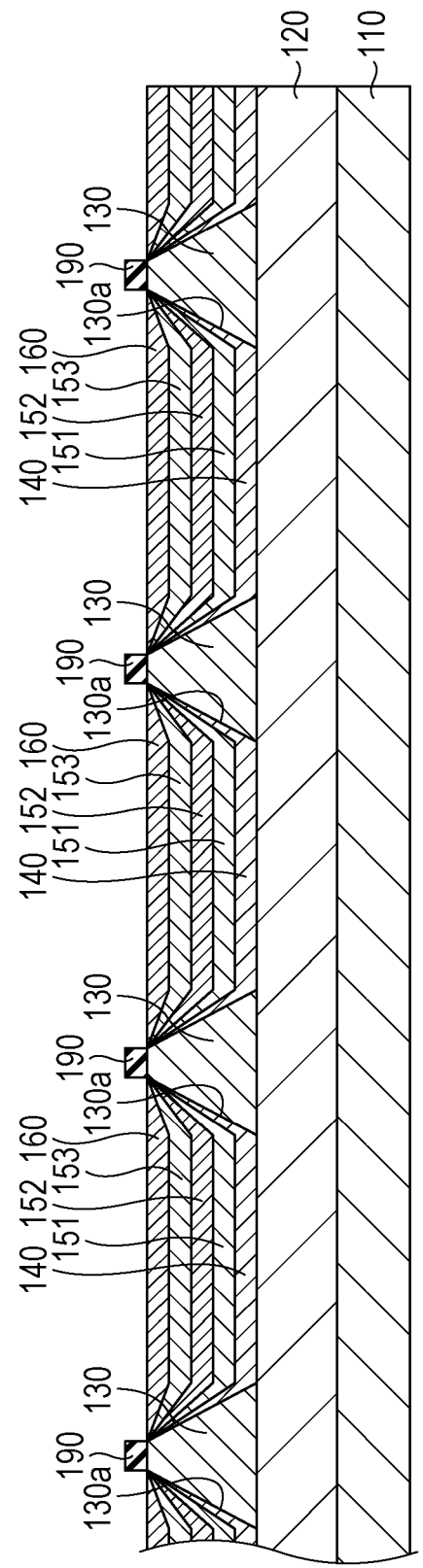
FIG. 8 is a process step diagram (5) of the method of manufacturing an infrared detector according to the first embodiment.

As illustrated in FIG. 8, on the first contact layer 120, the buffer layer 140, the p-T2SL layer 151, the i-T2SL absorbing layer 152, the n-T2SL layer 153, and the second contact layer 160 are formed in a laminated manner by solid-source molecular beam epitaxy. Specifically, the GaSb substrate 110 having the pixel separation wall 130 formed thereon is put in the chamber of the solid-source molecular beam epitaxy apparatus, and the GaSb substrate 110 is heated, for example. When the temperature of the GaSb substrate 110 reaches 400° C., the GaSb substrate 110 is further heated while the surfaces of the first contact layer 120 and the pixel separation wall 130 are being irradiated with the Sb beam. When the temperature of the GaSb substrate 110 reaches 500° C., oxide films on the surfaces of the first contact layer 120 and the pixel separation wall 130 start to be decomposed. With the temperature of the GaSb substrate 110 being 530° C., the surfaces of the first contact layer 120 and the pixel separation wall 130 are irradiated with the Sb beam for 20 minutes so that the oxide films on the surfaces of the first contact layer 120 and the pixel separation wall 130 are completely desorbed.

The temperature of the GaSb substrate 110 is lowered to 520° C. while Sb beam radiation is continued. Ga beam and Be beam radiation is further performed. With this, a p-GaSb film is formed on each of the first contact layer 120 and the side surface 130a of the pixel separation wall 130 so that the buffer layer 140 is formed. The buffer layer 140 has a thickness of approximately 1000 nm at the center portion of the pixel, and is doped with, as the p-type impurity element, Be at a concentration of $5.0 \times 10^{17}$ $cm^{-3}$, for example. The buffer layer 140 is formed by epitaxial growth, and hence the buffer layer 140 is grown on the first contact layer 120 and the side surface 130a of the pixel separation wall 130 but is not grown on the silicon oxide mask 190 because the silicon oxide mask 190 is amorphous. Thus, the silicon oxide mask 190 functions as a selective growth mask, and the buffer layer 140 is formed for the respective pixels in a separate manner with the silicon oxide mask 190.

Ga beam and Be beam radiation is stopped while Sb beam radiation is continued so that the temperature of the GaSb substrate 110 is lowered to 450° C. With the temperature of the GaSb substrate 110 being 450° C., the p-T2SL layer 151 is formed on the buffer layer 140. The p-T2SL layer 151 is formed of, for example, 200 periodic structures of an i-InAs layer having a thickness of 3 nm and a p-GaSb layer having a thickness of 1 nm. The p-T2SL layer 151 has a thickness of 800 nm. The i-InAs layer is a layer doped with no impurity element, and is formed by In beam and As beam radiation. The p-GaSb layer is a layer doped with, as the p-type impurity element, Be at a concentration of $1.0 \times 10^{17}$ cm$^{-3}$, and is formed by Ga beam, Sb beam, and Be beam radiation.

With the temperature of the GaSb substrate 110 being kept at 450° C., the i-T2SL absorbing layer 152 is formed on the p-T2SL layer 151. The i-T2SL absorbing layer 152 is formed of, for example, 200 periodic structures of an i-InAs layer having a thickness of 3 nm and an i-GaSb layer having a thickness of 1 nm. The i-T2SL absorbing layer 152 has a thickness of 800 nm. The i-InAs layer is a layer doped with no impurity element, and is formed by In beam and As beam radiation. The i-GaSb layer is a layer doped with no impurity element, and is formed by Ga beam and Sb beam radiation.

With the temperature of the GaSb substrate 110 being kept at 450° C., the n-T2SL layer 153 is formed on the i-T2SL absorbing layer 152. The n-T2SL layer 153 is formed of, for example, 200 periodic structures of a p-InAs layer having a thickness of 3 nm and an i-GaSb layer having a thickness of 1 nm. The n-T2SL layer 153 has a thickness of 800 nm. The n-InAs layer is a layer doped with, as the n-type impurity element, Si at a concentration of $1.0 \times 10^{17}$ cm$^{-3}$, and is formed by In beam, As beam, and Si beam radiation. The i-GaSb layer is a layer doped with no impurity element, and is formed by Ga beam and Sb beam radiation.

With the temperature of the GaSb substrate 110 being kept at 450° C., an n-InAs film is formed on the n-T2SL layer 153 so that the second contact layer 160 is formed. The second contact layer 160 has a thickness of approximately 100 nm and is doped with, as the n-type impurity element, Si at a concentration of $5.0 \times 10^{17}$ cm$^{-3}$, for example. The second contact layer 160 is formed by In beam, As beam, and Si beam radiation.

The p-T2SL layer 151, the i-T2SL absorbing layer 152, the n-T2SL layer 153, and the second contact layer 160 described above are formed by epitaxial growth, and hence are grown on the compound semiconductor crystal but are not grown on the silicon oxide mask 190. Thus, the p-T2SL layer 151, the i-T2SL absorbing layer 152, the n-T2SL layer 153, and the second contact layer 160 are formed for the respective pixels in a separate manner with the silicon oxide mask 190.

In beam and Si beam radiation is stopped while As beam radiation is continued so that the temperature of the GaSb substrate 110 is lowered. When the temperature of the GaSb substrate 110 reaches 400° C., As beam radiation is stopped. When the temperature of the GaSb substrate 110 reaches 100° C. or lower, the GaSb substrate 110 having formed thereon the components up to the second contact layer 160 is taken out from the chamber.

Figure 9:
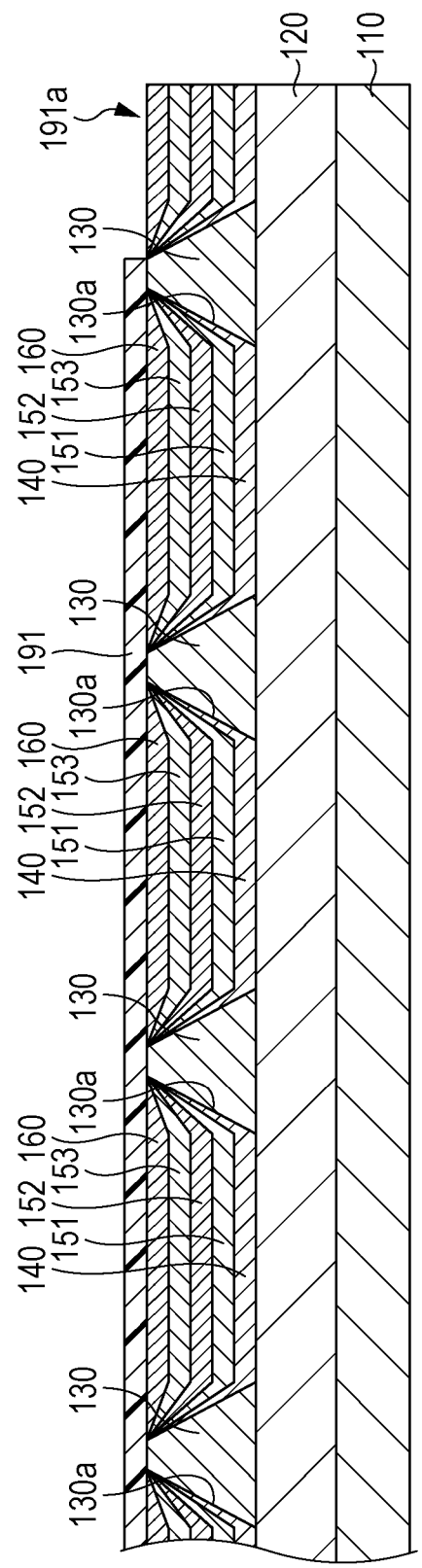
FIG. 9 is a process step diagram (6) of the method of manufacturing an infrared detector according to the first embodiment.

As illustrated in FIG. 9, after the silicon oxide mask 190 is removed, a resist pattern 191 is formed over the regions in which the pixels 181 are to be formed. Specifically, the silicon oxide mask 190 is removed by DHF, for example. A photoresist is applied on the second contact layer 160 and the pixel separation wall 130, and the resultant is subjected to exposure by the exposure apparatus and development so that the resist pattern 191 is formed in the regions in which the pixels 181 are to be formed. The resist pattern 191 has an opening portion 191a in a region including a region in which the lower electrode 72 is to be formed.

Figure 10:
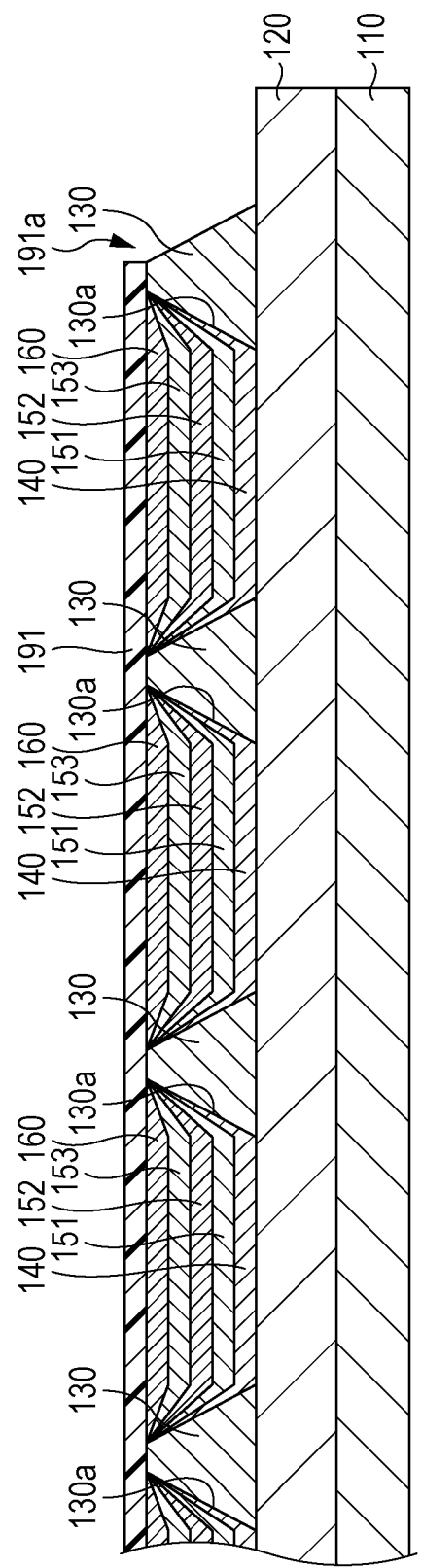
FIG. 10 is a process step diagram (7) of the method of manufacturing an infrared detector according to the first embodiment.

As illustrated in FIG. 10, the second contact layer 160, the n-T2SL layer 153, the i-T2SL absorbing layer 152, the p-T2SL layer 151, and the buffer layer 140 in the opening portion 191a of the resist pattern 191 are removed by wet etching. By this wet etching, which uses an etchant including phosphoric acid, hydrogen peroxide solution, and water, the surface of the first contact layer 120 and the side surface 130a of the pixel separation wall 130 are exposed in the opening portion 191a of the resist pattern 191.

Figure 11:
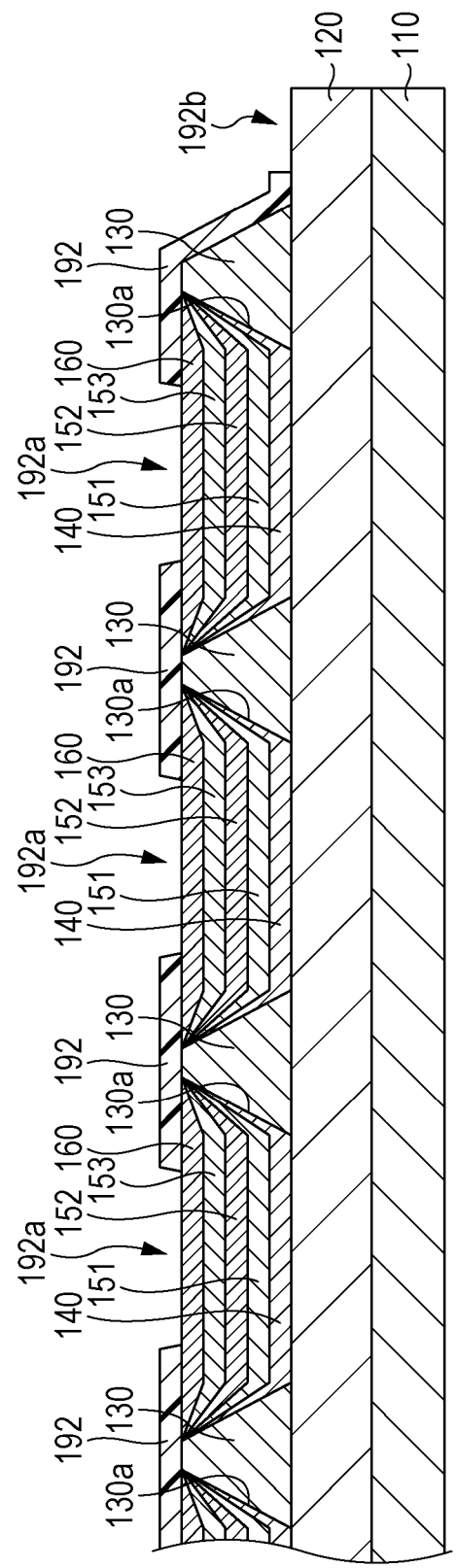
FIG. 11 is a process step diagram (8) of the method of manufacturing an infrared detector according to the first embodiment.

As illustrated in FIG. 11, the resist pattern 191 is removed by an organic solvent, for example. Thereafter, a resist pattern 192 having opening portions 192a and 192b in regions in which the upper electrode 171 and the lower electrode 172 are to be formed is formed. The resist pattern 192 is formed as follows: a photoresist is applied on the second contact layer 160, the pixel separation wall 130, and the first contact layer 120, and the resultant is subjected to exposure by the exposure apparatus and development.

Figure 12:
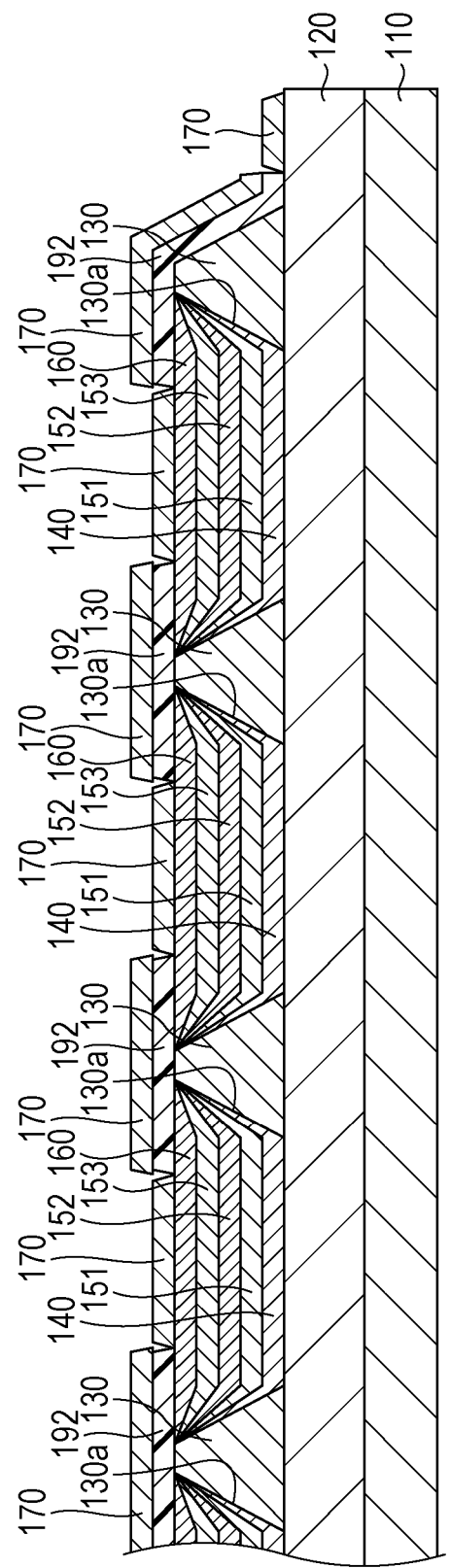
FIG. 12 is a process step diagram (9) of the method of manufacturing an infrared detector according to the first embodiment.

As illustrated in FIG. 12, a metal film 170, such as gold, is formed on the second contact layer 160, the first contact layer 120, and the resist pattern 192 by vacuum deposition.

Figure 13:
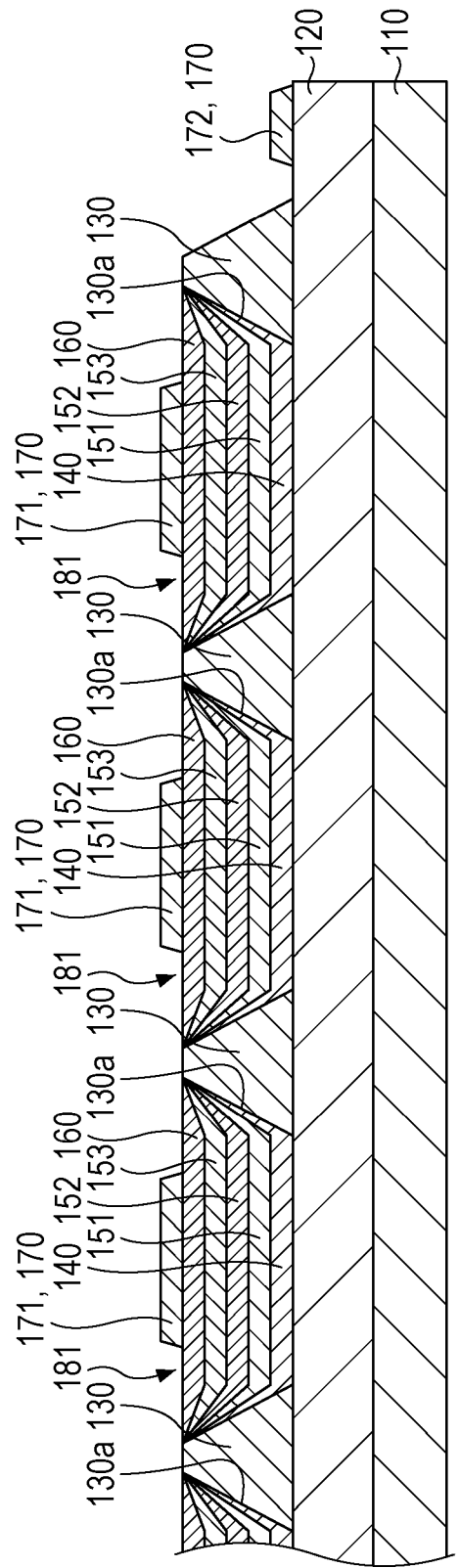
FIG. 13 is a process step diagram (10) of the method of manufacturing an infrared detector according to the first embodiment.

As illustrated in FIG. 13, the resultant is immersed in an organic solvent, for example, so that the metal film 170 on the resist pattern 192 is removed together with the resist pattern 192. With this, the upper electrode 171 is formed of the metal film 170 remaining in the opening portion 192a of the resist pattern 192, and the lower electrode 172 is formed of the metal film 170 remaining in the opening portion 192b.

Through the processes described above, the infrared detector according to the present embodiment may be manufactured. In the case described above, the infrared detector is formed by epitaxial growth by MBE, but the infrared detector according to the present embodiment may be formed by metal-organic vapor phase epitaxy (MOVPE).

(Infrared Detection Device)

Figure 14:
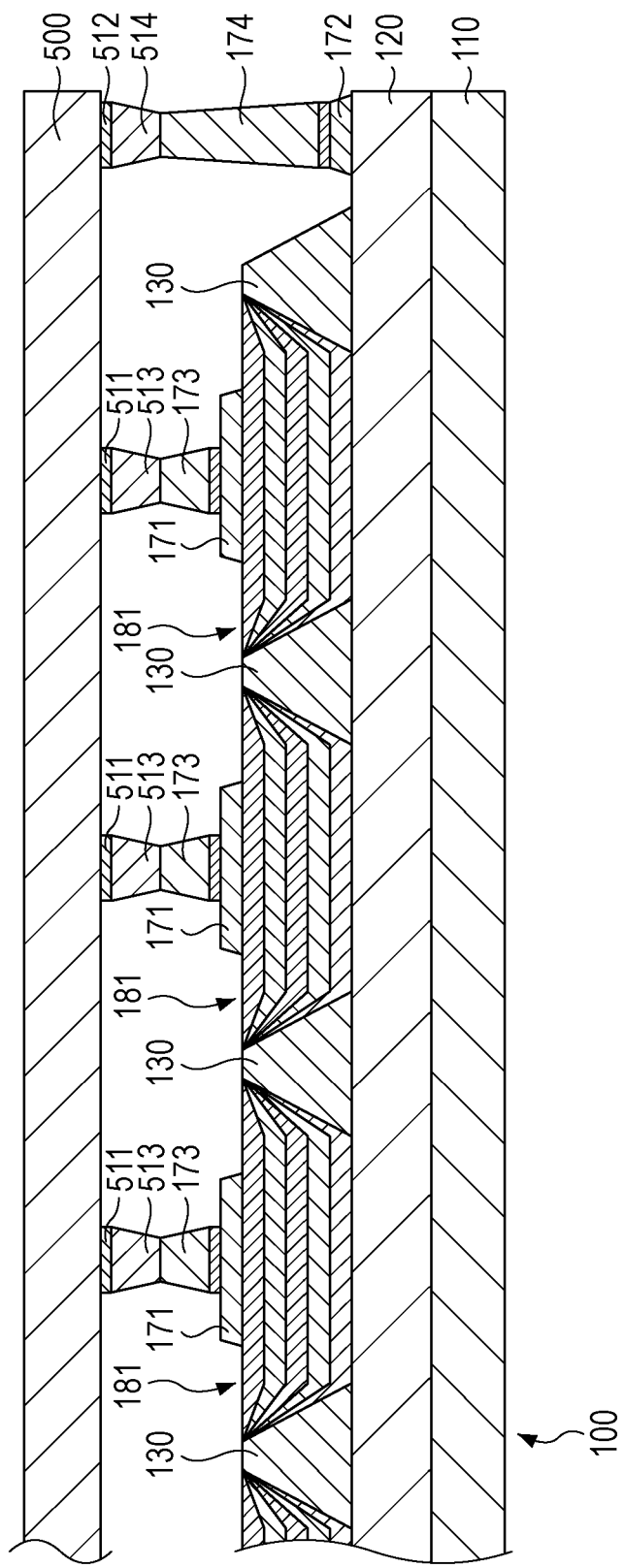
FIG. 14 is a structural diagram of an infrared detection device according to the first embodiment.
Figure 15:
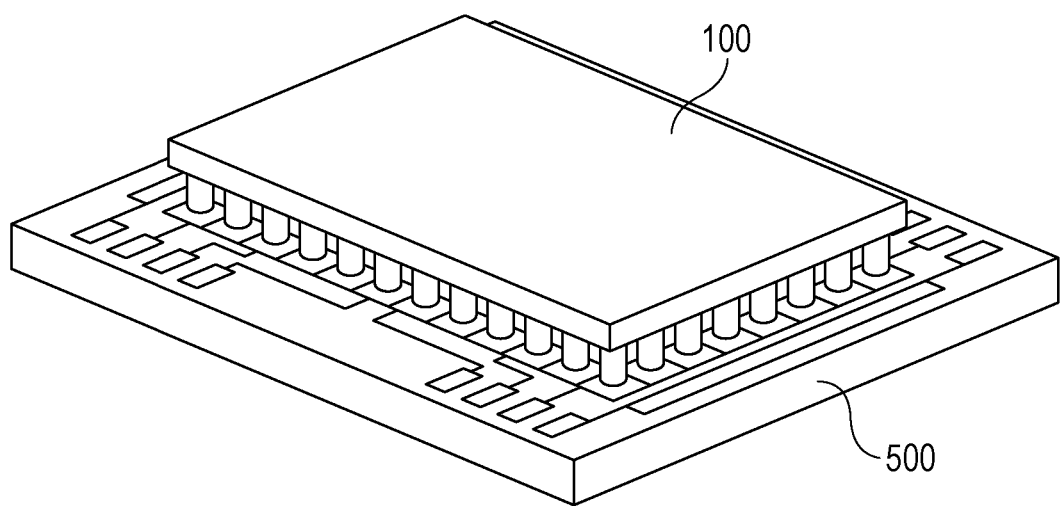
FIG. 15 is a perspective view of the infrared detection device according to the first embodiment.

In an infrared detection device according to the present embodiment, as illustrated in FIG. 14 and FIG. 15, a signal readout circuit element 500 is connected to the infrared detector 100. Thus, a bump 173 is formed above the upper electrode 171 of each of the pixels 181 of the infrared detector 100, and a bump 174 is formed above the lower electrode 172. The signal readout circuit element 500 has a signal readout circuit formed on the surface thereof, and bumps 513 and 514 are formed on electrodes 511 and 512 of the signal readout circuit element 500. The bump 173 corresponds to the bump 513, and the bump 174 corresponds to the bump 514. With the bump 173 connected to the corresponding bump 513, and the bump 174 connected to the corresponding bump 514, the infrared detector 100 and the signal readout circuit element 500 are connected to each other. With this, the infrared detection device according to the present embodiment is formed.

Second Embodiment

An infrared detector according to a second embodiment is described next. The infrared detector according to the present embodiment has a structure in which p-type components and n-type components are arranged reversely to those in the infrared detector according to the first embodiment.

Figure 16:
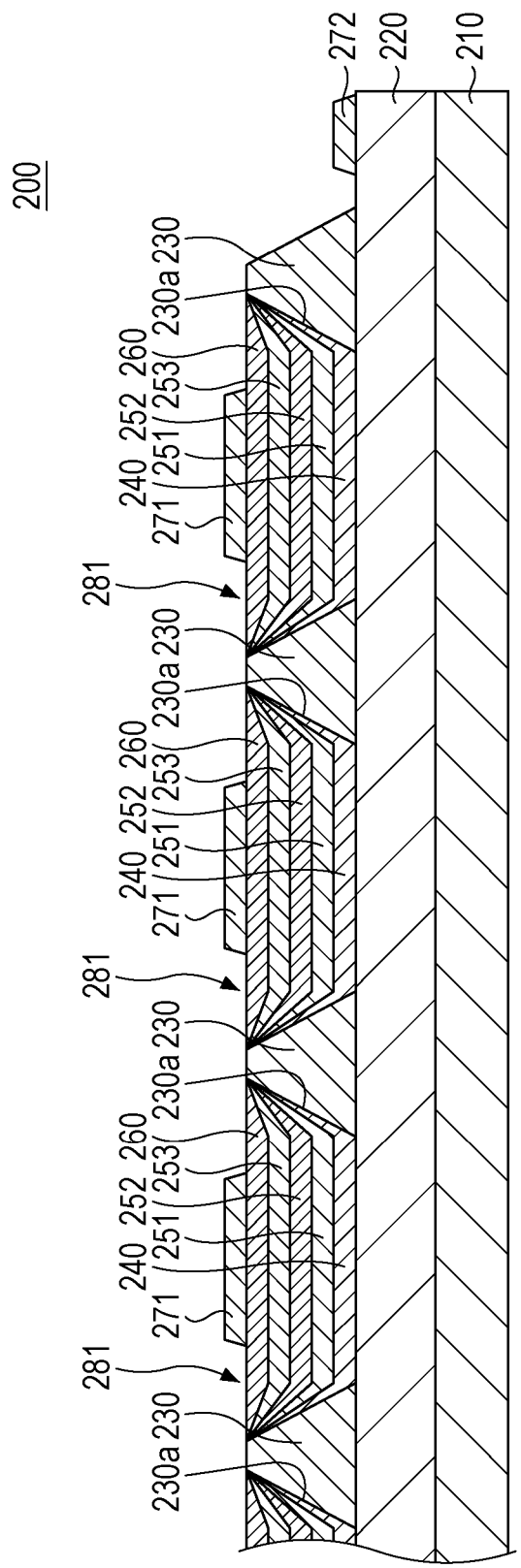
FIG. 16 is a structural diagram of an infrared detector according to a second embodiment.

In an infrared detector 200 according to the present embodiment, as illustrated in FIG. 16, a first contact layer 220 is formed on a GaSb substrate 210, and a pixel separation wall 230 configured to separate pixels is formed on the first contact layer 220. The pixel separation wall 230 is formed to surround each pixel. The pixel separation wall 230 has a trapezoid shape in section, and a side surface 230a is inclined.

On the first contact layer 220 in the region surrounded by the pixel separation wall 230, a buffer layer 240, an n-T2SL layer 251, an i-T2SL absorbing layer 252, a p-T2SL layer 253, and a second contact layer 260 are formed in a laminated manner. In this way, each of pixels 281 is formed of the buffer layer 240, the n-T2SL layer 251, the i-T2SL absorbing layer 252, the p-T2SL layer 253, and the second contact layer 260 formed in the region surrounded by the pixel separation wall 230. On the second contact layer 260 of each of the pixels 281, an upper electrode 271 that serves as an individual electrode is formed, and on the first contact layer 220, a lower electrode 272 that serves as a common electrode is formed.

The first contact layer 220 is formed of n-GaAs that is doped with Si as the n-type impurity element and has a thickness of 1000 nm, and the buffer layer 240 is formed of n-GaAs doped with Si as the n-type impurity element. The n-T2SL layer 251, the i-T2SL absorbing layer 252, and the p-T2SL layer 253 are each formed of the T2SL structure of InAs/GaSb. The n-T2SL layer 251 is doped with Si as the n-type impurity element, and the p-T2SL layer 253 is doped with Be as the p-type impurity element. The second contact layer 260 is formed of p-InAs doped with Be as the p-type impurity element.

In the infrared detector according to the present embodiment, the pixel separation wall 230 is formed so that the end of each of the pixels 281 is formed on the inclined side surface 230a of the pixel separation wall 230 in a laminated manner. The end surfaces of the p-T2SL layer 253, the i-T2SL absorbing layer 252, and the n-T2SL layer 251 are thus not exposed. This means that the p-T2SL layer 253, the i-T2SL absorbing layer 252, and the n-T2SL layer 251 are not exposed to the atmosphere and are therefore not oxidized. As a consequence, the dark current is not increased and the S/N ratio of the infrared detector is not reduced.

The buffer layer 240 is in contact with the pixel separation wall 230 on the side surface 230a of the pixel separation wall 230, and the pixel separation wall 230 is formed of p-GaSb while the buffer layer 240 is formed of n-GaSb. Thus, a depletion layer is formed on the side surface 230a of the pixel separation wall 230 by a p-n junction so that the respective pixels 281 are insulated from each other.

The remaining details of the second embodiment are similar to those of the first embodiment.

The embodiments have been described in detail so far, but the present technology is not limited to a specific embodiment and may be variously modified or changed without departing from the scope described in the appended claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An infrared detector comprising:
a semiconductor crystal substrate;
a first contact layer formed on the semiconductor crystal substrate, the first contact layer being a compound semiconductor of a first conductivity type;
a plurality of pixels formed on the first contact layer;
a pixel separation wall, formed on the first contact layer, configured to separate each of the plurality of pixels, the pixel separation wall being a compound semiconductor of a second conductivity type;
the plurality of pixels including a buffer layer formed on the first contact layer and of the compound semiconductor of the first conductivity type and formed on a side surface of the pixel separation wall in a region surrounded by the pixel separation wall;
an infrared-absorbing layer formed on the buffer layer and being a compound semiconductor;
a second contact layer formed on the infrared-absorbing layer and being of the compound semiconductor of the second conductivity type;
an upper electrode formed on the second contact layer; and
a lower electrode formed on the first contact layer.

2. The infrared detector according to claim 1, wherein the infrared-absorbing layer is formed of a superlattice structure.

3. The infrared detector according to claim 1, wherein the infrared-absorbing layer is formed of a superlattice structure of indium arsenide (InAs) and gallium antimonide (GaSb).

4. The infrared detector according to claim 1, wherein the infrared-absorbing layer includes
a superlattice structure layer of the first conductivity type formed on the buffer layer,
a non-doped superlattice structure layer formed on the superlattice structure layer of the first conductivity type, and
a superlattice structure layer of the second conductivity type formed on the non-doped superlattice structure layer.

5. The infrared detector according to claim 1, wherein the first contact layer is formed of a material including GaSb of the first conductivity type,
the pixel separation wall is formed of a material including GaSb of the second conductivity type, and
the buffer layer is formed of the material including GaSb of the first conductivity type.

6. The infrared detector according to claim 1, wherein the first conductivity type is a p type and the second conductivity type is an n type.

7. The infrared detector according to claim 1, wherein the first conductivity type is an n type and the second conductivity type is a p type.

8. The infrared detector according to claim 1, wherein the semiconductor crystal substrate is formed of GaSb, and
the second contact layer is formed of a material including InAs of the second conductivity type.

9. An infrared detection device, comprising:
the infrared detector according to claim 1; and
a signal readout circuit element that is connected to the infrared detector.

10. A method of manufacturing an infrared detector, comprising:
forming, on a semiconductor crystal substrate, a first contact layer of a compound semiconductor of a first conductivity type and a separation wall forming layer of a compound semiconductor of a second conductivity type in a laminated manner by epitaxial growth;
forming a silicon oxide mask on the separation wall forming layer;
forming a pixel separation wall by removing the separation wall forming layer with the silicon oxide mask being a mask;

forming, on the first contact layer and a side surface of the pixel separation wall, a buffer layer of the compound semiconductor of the first conductivity type, an infrared-absorbing layer of a compound semiconductor, and a second contact layer of the compound semiconductor of the second conductivity type in a laminated manner by epitaxial growth; and forming an upper electrode on the second contact layer and a lower electrode on the first contact layer.

11. The method of manufacturing an infrared detector according to claim 10, wherein
the forming the pixel separation wall includes removing the separation wall forming layer by wet etching with the silicon oxide mask being the mask.

12. The method of manufacturing an infrared detector according to claim 10, wherein
the forming the buffer layer, the infrared-absorbing layer, and the second contact layer in a laminated manner includes selectively growing the buffer layer, the infrared-absorbing layer, and the second contact layer with the silicon oxide mask remaining on the pixel separation wall.

13. The method of manufacturing an infrared detector according to claim 10, wherein
the infrared-absorbing layer is formed of a superlattice structure.

14. The method of manufacturing an infrared detector according to claim 10, wherein
the infrared-absorbing layer is formed of a superlattice structure of InAs and GaSb.

15. The method of manufacturing an infrared detector according to claim 10, wherein
the infrared-absorbing layer includes
a superlattice structure layer of the first conductivity type formed on the buffer layer,
a non-doped superlattice structure layer formed on the superlattice structure layer of the first conductivity type, and
a superlattice structure layer of the second conductivity type formed on the non-doped superlattice structure layer.

16. The method of manufacturing an infrared detector according to claim 10, wherein
the first contact layer is formed of a material including GaSb of the first conductivity type,
the pixel separation wall is formed of a material including GaSb of the second conductivity type, and
the buffer layer is formed of the material including GaSb of the first conductivity type.

17. The method of manufacturing an infrared detector according to claim 10, wherein
the first conductivity type is a p type and the second conductivity type is an n type.

18. The method of manufacturing an infrared detector according to claim 10, wherein
the first conductivity type is an n type and the second conductivity type is a p type.

19. The method of manufacturing an infrared detector according to claim 10, wherein
the semiconductor crystal substrate is formed of GaSb, and
the second contact layer is formed of a material including InAs of the second conductivity type.

20. The method of manufacturing an infrared detector according to claim 10, wherein
the epitaxial growth is achieved by molecular beam epitaxy.

* * * * *